US011908696B2

(12) United States Patent
Ren et al.

(10) Patent No.: US 11,908,696 B2
(45) Date of Patent: *Feb. 20, 2024

(54) METHODS AND DEVICES FOR SUBTRACTIVE SELF-ALIGNMENT

(71) Applicant: Applied Materials, Inc., Santa Clara, CA (US)

(72) Inventors: He Ren, San Jose, CA (US); Hao Jiang, San Jose, CA (US); Mehul Naik, San Jose, CA (US); Wenting Hou, San Jose, CA (US); Jianxin Lei, Fremont, CA (US); Chen Gong, Nanjing (CN); Yong Cao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 47 days.

This patent is subject to a terminal disclaimer.

(21) Appl. No.: 17/569,870

(22) Filed: Jan. 6, 2022

(65) Prior Publication Data
US 2022/0130676 A1 Apr. 28, 2022

Related U.S. Application Data

(63) Continuation of application No. 16/751,691, filed on Jan. 24, 2020, now Pat. No. 11,257,677.

(51) Int. Cl.
*H01L 21/285* (2006.01)
*H01L 21/768* (2006.01)
(Continued)

(52) U.S. Cl.
CPC ...... *H01L 21/2855* (2013.01); *C23C 14/0641* (2013.01); *C23C 14/14* (2013.01);
(Continued)

(58) Field of Classification Search
CPC ..... H01L 21/76843; H01L 2224/05124; H01L 2224/05166; H01L 2224/05181;
(Continued)

(56) References Cited

U.S. PATENT DOCUMENTS 4,536,951 A 8/1985 Rhodes et al.
4,954,423 A 9/1990 McMann et al.
(Continued)

FOREIGN PATENT DOCUMENTS

JP 2010283360 A 12/2010
JP 2011115374 A 8/2011
(Continued)

OTHER PUBLICATIONS

"PCT International Search Report and Written Opinion in PCT/US2020/057136 dated Feb. 9, 2021, 9 pages".
(Continued)

*Primary Examiner* — Jaehwan Oh
(74) *Attorney, Agent, or Firm* — Servilla Whitney LLC

(57) ABSTRACT

A method of forming an interconnect structure for semiconductor devices is described. The method comprises depositing an etch stop layer on a substrate by physical vapor deposition followed by in situ deposition of a metal layer on the etch stop layer. The in situ deposition comprises flowing a plasma processing gas into the chamber and exciting the plasma processing gas into a plasma to deposit the metal layer on the etch stop layer on the substrate. The substrate is continuously under vacuum and is not exposed to ambient air during the deposition processes.

10 Claims, 13 Drawing Sheets

(51) Int. Cl.
  *C23C 14/56* (2006.01)
  *C23C 14/14* (2006.01)
  *C23C 14/24* (2006.01)
  *C23C 14/06* (2006.01)

(52) U.S. Cl.
  CPC .............. *C23C 14/24* (2013.01); *C23C 14/56* (2013.01); *H01L 21/76829* (2013.01); *H01L 21/76876* (2013.01)

(58) Field of Classification Search
  CPC . H01L 2224/05684; H01L 2924/01022; H01L 2924/01029; H01L 2924/01074; H01L 2924/04941; C23C 14/34; C23C 14/022; C23C 14/35
  See application file for complete search history.

(56) References Cited

U.S. PATENT DOCUMENTS

| | | | |
|---|---|---|---|
| 4,960,489 A | 10/1990 | Roeska | |
| 5,025,303 A | 6/1991 | Brighton | |
| 5,515,984 A | 5/1996 | Yokoyama et al. | |
| 5,654,216 A | 8/1997 | Adrian | |
| 6,027,860 A | 2/2000 | McClure et al. | |
| 6,057,081 A | 5/2000 | Yunogami et al. | |
| 6,133,635 A | 10/2000 | Bothra et al. | |
| 6,281,585 B1 | 8/2001 | Bothra | |
| 6,399,508 B1 | 6/2002 | Ting et al. | |
| 6,432,835 B1 | 8/2002 | Yunogami et al. | |
| 6,433,436 B1 | 8/2002 | Feild et al. | |
| 6,692,903 B2 | 2/2004 | Chen et al. | |
| 6,984,585 B2 | 1/2006 | Ying et al. | |
| 7,049,226 B2* | 5/2006 | Chung ............. | H01L 21/76846 438/618 |
| 7,244,683 B2* | 7/2007 | Chung ............. | H01L 21/02063 438/785 |
| 7,320,942 B2 | 1/2008 | Chen et al. | |
| 7,365,005 B1* | 4/2008 | Gadgil ............ | C23C 16/045 257/E21.585 |
| 7,732,314 B1 | 6/2010 | Danek et al. | |
| 7,837,838 B2* | 11/2010 | Chua ............... | H01L 21/02329 204/192.15 |
| 7,955,979 B2* | 6/2011 | Kostamo ......... | H01L 21/76843 257/E21.585 |
| 8,668,816 B2* | 3/2014 | Ding ............... | C23C 14/35 204/298.25 |
| 9,390,909 B2* | 7/2016 | Pasquale ......... | H01L 21/0332 |
| 9,761,489 B2 | 9/2017 | Mebarki et al. | |
| 10,770,308 B2 | 9/2020 | Tahara et al. | |
| 2001/0049181 A1* | 12/2001 | Rathi .............. | C23C 16/0245 257/E21.585 |
| 2002/0016085 A1* | 2/2002 | Huang ............ | H01L 21/02167 257/E21.241 |
| 2002/0076925 A1* | 6/2002 | Marieb ........... | H01L 21/76843 257/E21.585 |
| 2002/0117758 A1* | 8/2002 | Mukherjee ...... | H01L 21/32115 257/E21.309 |
| 2002/0155693 A1 | 10/2002 | Hong et al. | |
| 2003/0000844 A1 | 1/2003 | Carl et al. | |
| 2003/0020176 A1 | 1/2003 | Nambu | |
| 2003/0027427 A1* | 2/2003 | Ma ................... | H01L 21/76802 438/700 |
| 2003/0180968 A1 | 9/2003 | Nallan et al. | |
| 2003/0232495 A1* | 12/2003 | Moghadam ...... | H01L 21/3146 438/789 |
| 2004/0046260 A1* | 3/2004 | Huang ............. | H01L 21/76883 257/E21.585 |
| 2004/0124438 A1* | 7/2004 | Mukherjee ...... | H01L 21/3212 257/E21.583 |
| 2004/0131878 A1* | 7/2004 | Seet ................ | C23C 14/165 428/641 |
| 2004/0211665 A1* | 10/2004 | Yoon ............... | H01L 21/28556 257/E21.17 |
| 2004/0256351 A1* | 12/2004 | Chung ............. | H01L 21/28556 257/E21.252 |
| 2005/0176237 A1 | 8/2005 | Standaert et al. | |
| 2007/0238279 A1 | 10/2007 | Cerio, Jr. | |
| 2008/0110747 A1* | 5/2008 | Ding ............... | H01J 37/321 204/192.15 |
| 2011/0117749 A1 | 5/2011 | Sheu et al. | |
| 2011/0306215 A1 | 12/2011 | Ding et al. | |
| 2013/0087447 A1 | 4/2013 | Bodke et al. | |
| 2014/0239246 A1 | 8/2014 | Noda | |
| 2014/0273430 A1 | 9/2014 | Naik et al. | |
| 2015/0056800 A1 | 2/2015 | Mebarki et al. | |
| 2016/0099174 A1 | 4/2016 | Wu et al. | |
| 2016/0197011 A1 | 7/2016 | Bristol et al. | |
| 2016/0293418 A1* | 10/2016 | Pasquale ......... | H01L 21/0332 |
| 2016/0336178 A1* | 11/2016 | Swaminathan ... | C23C 16/45542 |
| 2017/0033004 A1 | 2/2017 | Siew et al. | |
| 2017/0047290 A1 | 2/2017 | Singh et al. | |
| 2018/0155834 A1* | 6/2018 | Srinivasan ....... | H01L 21/28562 |
| 2018/0158694 A1 | 6/2018 | Lin et al. | |
| 2019/0067089 A1 | 2/2019 | Yang et al. | |
| 2019/0096834 A1* | 3/2019 | Bih ................. | H01L 24/05 |
| 2019/0172716 A1* | 6/2019 | Graoui ............ | H01L 21/3212 |
| 2020/0027782 A1 | 1/2020 | Jiang et al. | |
| 2020/0135459 A1 | 4/2020 | Jiang et al. | |
| 2020/0303252 A1 | 9/2020 | Zhang et al. | |
| 2020/0350206 A1 | 11/2020 | Ren et al. | |
| 2021/0082804 A1 | 3/2021 | Wu et al. | |
| 2021/0098293 A1 | 4/2021 | Straten et al. | |
| 2021/0233770 A1 | 7/2021 | Ren et al. | |

FOREIGN PATENT DOCUMENTS

| | | |
|---|---|---|
| KR | 100699865 B1 | 3/2007 |
| TW | 201801275 A | 1/2018 |
| WO | 2015094501 A1 | 6/2015 |

OTHER PUBLICATIONS

"PCT International Search Report and Written Opinion in PCT/US2020/057142 dated Feb. 10, 2021, 9 pages".

* cited by examiner

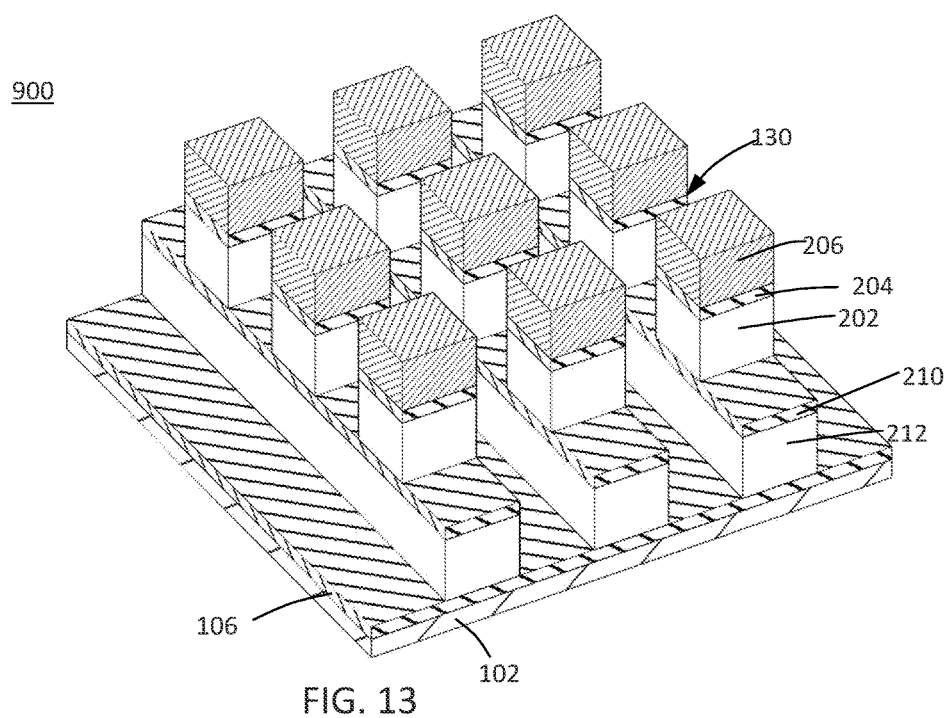
FIG. 13
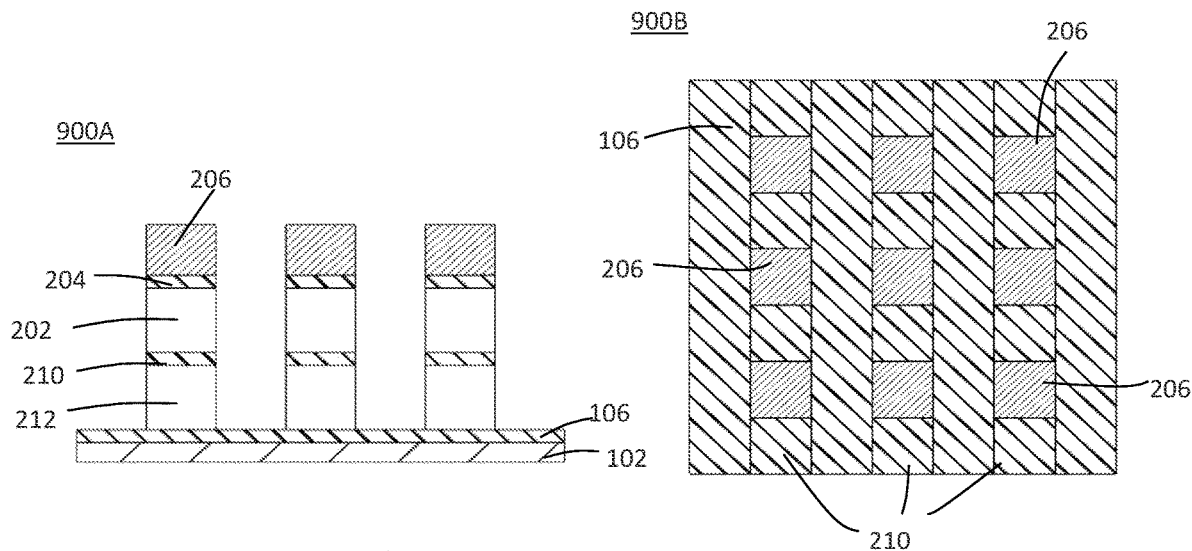
FIG. 13A
FIG. 13B

METHODS AND DEVICES FOR SUBTRACTIVE SELF-ALIGNMENT

CROSS-REFERENCE TO RELATED APPLICATIONS

This application is a continuation of U.S. application Ser. No. 16/751,691, filed Jan. 24, 2020, the entire disclosure of which is hereby incorporated by reference herein.

TECHNICAL FIELD

Embodiments of the present disclosure pertain to the field of interconnect structures and interconnect structure manufacturing. More particularly, embodiments of the disclosure provide methods for creating interconnect structures with aligned vias and/or contacts using a subtractive process.

BACKGROUND

Interconnect structures, such as personal computers, workstations, computer servers, mainframes and other computer related equipment such as printers, scanners and hard disk drives use logic and memory devices that provide substantial data storage capability and capacity, while incurring low power consumption. The scaling of features has been a driving force behind an ever growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

On-chip electrical interconnections have previously been produced using "dual-damascene" fabrication techniques in which apertures are created through various layers of the device structure, and the apertures are filled with a conductive material to form the interconnects between layers and between device features located on individual layers. Dual-damascene can allow formation of vias (Vx) that are self-aligned with the above metal line (Mx). For chips which are based on 50 nm pitch (25 nm half-pitch dimension) and smaller feature sizes, however, there are gap fill and resistivity constraints which make it impractical to use the "dual-damascene" fabrication techniques which have previously been relied upon.

Accordingly, there is a need for a processing method that improve line resistance and via resistance.

SUMMARY

One or more embodiments of the disclosure are directed to a method of forming an interconnect structure. In one or more embodiments, the method comprises: depositing an etch stop layer on a substrate, wherein deposition comprises physical vapor deposition; and in situ depositing a metal layer on the etch stop layer, wherein the in situ deposition comprises flowing a plasma processing gas into the chamber and exciting the plasma processing gas into a plasma to deposit the metal layer on the etch stop layer on the substrate, wherein the substrate is continuously under vacuum and is not exposed to ambient air.

Additional embodiments of the disclosure are directed to a processing tool. In one or more embodiment, the processing tool comprises: a central transfer station comprising a robot configured to move a wafer; and a plurality of process stations, each process station connected to the central transfer station and providing a processing region separated from processing regions of adjacent process stations, the plurality of process stations comprising a first physical vapor deposition chamber and a second physical vapor deposition chamber.

Further embodiments of the disclosure are directed to a non-transitory computer readable medium including instructions. In one or more embodiments, a non-transitory computer readable medium including instructions, that, when executed by a controller of a processing chamber, causes the processing chamber to perform operations of: deposit an etch stop layer on a substrate; in situ deposit a metal layer on the etch stop layer; and maintain the substrate continuously under vacuum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 13 is illustrates an isometric view of an interconnect structure according to one or more embodiment of the disclosure;

FIG. 13A illustrates cross-section view of the interconnect structure of FIG. 13 according to one or more embodiments;

FIG. 13B illustrates a top view of the interconnect structure of FIG. 13 according to one or more embodiments;

DETAILED DESCRIPTION

Figure 1:
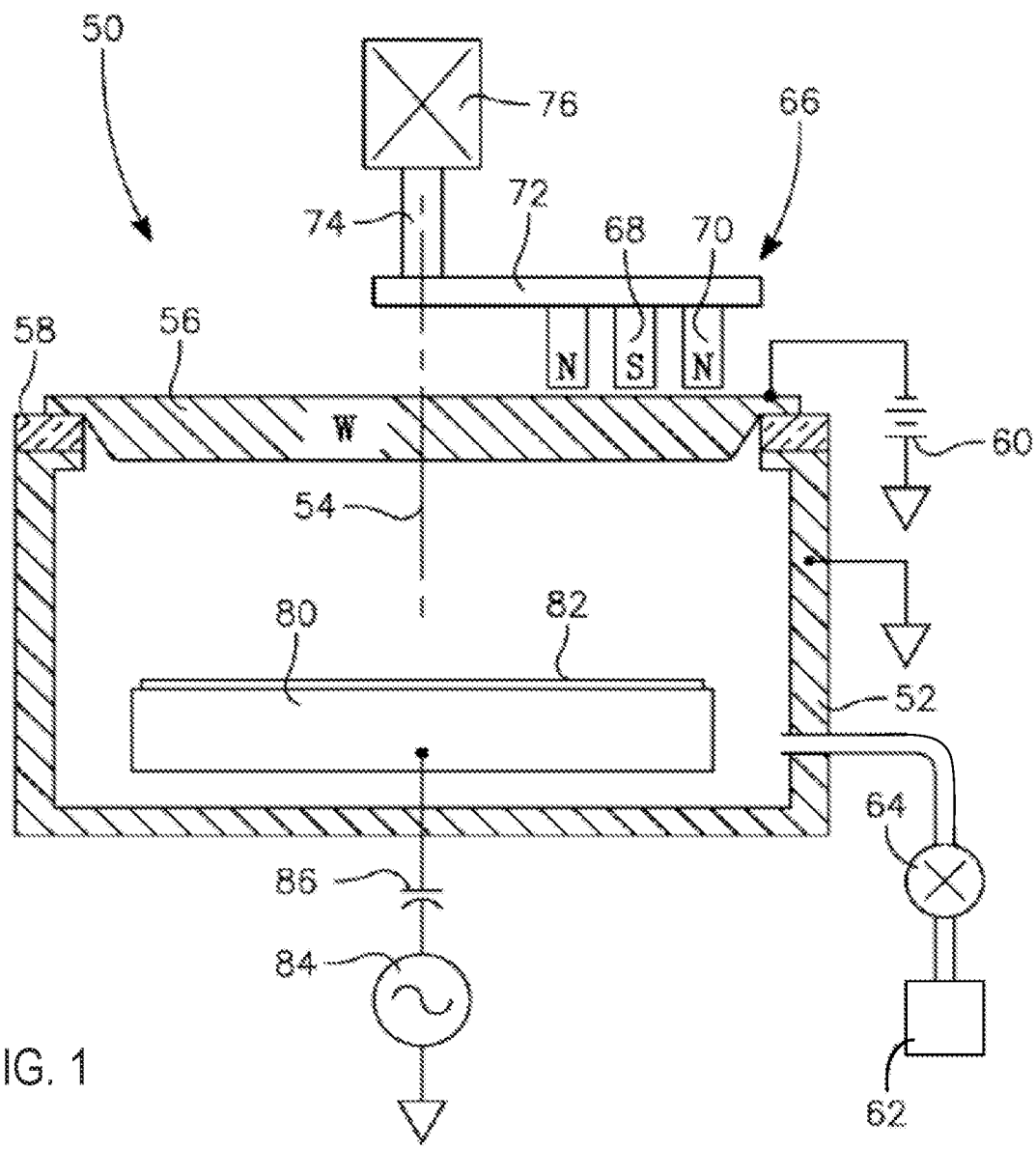
FIG. 1 illustrates a schematic cross-sectional view of a physical vapor deposition chamber in accordance with one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

One or more embodiments advantageously provide an integrated process of forming an interconnect. In one or more embodiments, both core metal deposition and metal etch-stop deposition are optimized into low resistivity films at its own process capability. The deposition chambers are integrated on the same processing platform at a high vacuum level to avoid undesirable metal oxidation.

One or more embodiments of the disclosure advantageously provide methods that enable vias to be aligned (relative to the bottom line) based on a subtractive scheme. Embodiments of the self-aligned subtractive scheme allow for formation of an interconnect structure with a etch stop layer/liner. Some embodiments advantageously provide self-alignment of the via.

One or more embodiments of the disclosure advantageously improve chip interconnect resistance scaling. Resistance scaling includes two parts: line resistance and via resistance. In one or more embodiments, line resistance is improved by implementing low-resistivity metal deposition. In one or more embodiments, via resistance is improved by integrating (no vacuum break) ultra-thin and low-resistivity metal etch stop layer.

In one or more embodiments, compared to conventional dual damascene interconnect fabrication, the processes of one or more embodiments advantageously achieves 15-50% or more of line resistance reduction, and 20-30% or more of via resistance reduction. When compared to conventional dual damascene methods of depositing metals, the processes of one or more embodiments achieves 50% or more of film resistivity for both core metal and metal etch stop films. Additionally, in one or more embodiments, the integrated platform further reduces the effective resistivity by about 20%.

An example of a physical vapor deposition chamber 50 useful for depositing the etch stop layer and metal layer of one or more embodiments is schematically illustrated in FIG. 1. The physical vapor deposition chamber 50 includes a vacuum chamber 52 arranged about a central axis 54 on which a target 56 is supported through an isolator 58, which vacuum seals the target 56 to the vacuum chamber 52 and electrically isolates the target 56 from the electrically grounded vacuum chamber 52. A vacuum pump system (not shown) pumps the interior of the vacuum chamber 52 to a pressure in the low milliTorr range.

In one or more embodiments, the shape of the front surface of the target 56 can be planar or generally concave with thicker outer peripheral edges than inner diameter portions. The target 56 includes a layer of metal facing the interior of the vacuum chamber 52 and which typically contains no more than 5 atomic % of elements other than the metal to be deposited to provide a source of sputtered metal.

A DC power source 60 negatively biases the target with respect to the grounded vacuum chamber 52 or grounded sidewall shield (not shown) to excite a plasma processing gas into a plasma.

In one or more embodiments, the plasma processing gas comprises one or more of neon (Ne), argon (Ar), krypton (Kr), and xenon (Xe), and is supplied into the vacuum chamber 52 from a gas source through a mass flow controller. In specific embodiments, the plasma processing gas comprises krypton (Kr). Without intending to be bound by theory, it is thought that using a gas source 62 comprising krypton (Kr) as a plasma processing gas does not result in embedding of the krypton atoms. Therefore, in one or more embodiments, the plasma processing gas comprises, consists essentially of, or consists of krypton (Kr). In some embodiments, the plasma processing gas comprises substantially only krypton atoms. In one or more embodiments, the gas source 62 is connected to the vacuum chamber 52 through a mass flow controller 64.

In one or more embodiments, the target power excites the plasma processing gas into a plasma and positively charged ions of the plasma are accelerated towards the target 54 and sputter metal atoms from it. The density of the plasma is increased by placing in back of the target 56 a magnetron 66 having an inner magnetic pole 68 of one magnetic polarity surrounded by an outer magnetic pole 70 of the opposed magnetic polarity. The poles 68, 70 project a magnetic field into the vacuum chamber 52 parallel to the face of the target 56 to trap electrons and hence increase the plasma density and the resultant sputtering rate. To improve the sputtering uniformity and target utilization, the magnetic poles 68, 70 are asymmetric about the central axis 54 but supported on an arm 72 connected to a shaft 74 extending along the central axis 54. A motor 76 rotates the shaft 74 and hence the magnetron 66 about the central axis 54 to provide at least azimuthal uniformity.

A pedestal 80 within the vacuum chamber 52 supports a substrate 82 in opposition to the target 56 to be coated with the metal sputtered from the target 56. Optionally, an RF power source 84 biases the pedestal 80 through a capacitive coupling circuit 86. The pedestal 80 is conductive so that it acts as an electrode. The RF bias in the presence of a plasma within the vacuum chamber 52 causes a negative DC self-bias to develop on the pedestal 80 so that sputtered metal ions are accelerated towards the substrate 82 and their trajectories enter deep within any high aspect-ratio holes formed in the substrate 82.

In one or more embodiments, the physical vapor deposition processing chamber used for the deposition of the etch stop layer differs from the physical vapor deposition processing chamber used for the metal layer deposition in terms of the sputter plasma source. In one or more embodiments, the physical vapor deposition processing chamber used for deposition of the bulk metal has either a DC or RF source, while the physical vapor deposition processing chamber used for deposition of the etch-stop layer has a RF source. Additionally, the physical vapor deposition processing chamber used for deposition of the bulk metal has a pedestal/wafer temperature that operates at high temperature, above 250° C., while etch-stop layer deposition occurs at a low temperature, about 20° C. to about 400° C. Furthermore, the physical vapor deposition processing chamber used for deposition of the bulk metal uses krypton (Kr) as the sputter gas, whereas deposition of the etch stop layer use $N_2$ (nitridation) for a titanium (Ti) target or argon (Ar) for titanium nitride (TiN) target.

Embodiments of the disclosure create an interconnect structure which includes the deposition of multiple layers of materials, followed by the use of subtractive techniques such as the dry etch techniques or Atomic Layer Etch (ALE). In one or more embodiments, the conductive interconnect structures formed are surrounded by dielectric materials as necessary.

Figure 2:
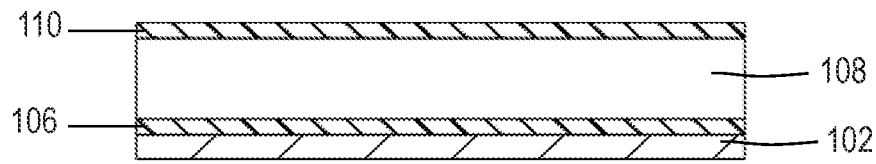
FIG. 2 illustrates a cross-sectional view of a substrate in accordance with one or more embodiments of the disclosure.

With reference to FIG. 2, in one or more embodiments, an first etch stop layer 110 is formed on a substrate 102. The substrate 102 can be any suitable material as described herein. For descriptive purposes only, the substrate 102 will be discussed as a silicon substrate. In one or more embodiments, the substrate 102 represents a structure which is contacted with an underlying semiconductor structure to connect the interconnect structure with an underlying semiconductor device. The substrate 102 may be a tungsten plug if connected to a FEOL (front end of line) device such as a transistor, capacitor, or resistor, for example; or, the substrate 102 may be copper or other conductive plug material if an interconnect is required.

The illustrated embodiment includes an optional barrier layer 106. In one or more embodiments, the barrier layer 106 comprises a liner. In one or more embodiments, the barrier layer 106 can also be omitted from the stack. For example, if the first metal layer 108 has good adhesion to the substrate 102, then the optional barrier layer 106 may be superfluous. The optional barrier layer 106 can be any suitable material that can increase adhesion of the first metal layer 108 to the substrate 102. In one or more embodiments, the barrier layer 106 comprises on or more of tantalum (Ta), titanium (Ti), tantalum nitride (TaN), titanium nitride (TiN), or tantalum/tantalum nitride (Ta/TaN). The optional barrier layer 106 can be deposited by any suitable technique known to the skilled artisan including, but not limited to, atomic layer deposition (ALD), chemical vapor deposition (CVD), physical vapor deposition (PVD), evaporation or plating.

In one or more embodiments, a first metal (conductive) layer 108 is on the optional barrier layer 106; or on the substrate 102 if the optional barrier layer 106 is omitted. In one or more embodiments, the barrier layer 106 comprises a liner. The first metal layer 108 can be any suitable layer deposited by any suitable technique known to the skilled artisan. In one or more embodiments, the first metal layer 108 is deposited using a physical vapor deposition.

In one or more embodiments, a first etch stop layer 110, which is also a conductor layer, overlies the first metal layer 108. In one or more embodiments, the first etch stop layer 110 comprises an etch stop material. The etch stop material may comprise any suitable material known to one of skill in the art. In one or more embodiments, the etch stop material comprises one or more of titanium (Ti), titanium nitride (TiN), tantalum (Ta), tantalum nitride (TaN), molybdenum (Mo), tungsten (W), or ruthenium (Ru). In specific embodiments, the etch stop material comprises titanium nitride (TiN).

In one or more embodiments, the first etch stop layer 110 is formed by physical vapor deposition (PVD) using a processing chamber, such as that illustrated in FIG. 1. In one or more embodiments, a high frequency RF source is used to produce a highly ionized plasma having a high concentration of metal ions. Without intending to be bound by theory, it is thought that the highly ionized plasma facilitates modifying the first etch stop layer's 110 crystalline orientation, leading to a positive combination of tensile stress and high density, resulting in superior etch selectivity.

In one or more embodiments, a target 54 comprising the etch stop material is provided in a processing chamber 50 illustrated in FIG. 1. The pedestal 80 comprises a high current electrostatic chuck at a temperature in a range of from about 20° C. to about 400° C., including a range of from about 200° C. to about 300° C. In one or more embodiments, the pedestal 80 within the processing chamber 50 supports a substrate 102 in opposition to the target 54 to be coated with the first etch stop layer 110 sputtered from the target 54. In one or more embodiments, an RF power source biases the pedestal supporting the substrate 102 through a capacitive coupling circuit. The pedestal is conductive so that it acts as an electrode. The RF bias in the presence of a plasma within the processing chamber causes a negative DC self-bias to develop on the pedestal 80 so that sputtered etch stop material ions are accelerated towards the substrate 102 and their trajectories enter deep within any high aspect-ratio holes formed in the substrate 102. In one or more embodiments, the RF power source is in a range of from about 1 kW to about 10 kW, including a range of from about 2 kW to about 3 kW.

In one or more embodiments, the first etch stop layer 110 that is deposited on the substrate 102 has a thickness in a range of from about 0.5 nm to 5.0 nm.

Figure 3:
FIG. 3 illustrates a cross-sectional view of a substrate in accordance with one or more embodiments of the disclosure.

Referring to FIG. 3, in one or more embodiments, after the first etch stop layer 110 is deposited, a metal layer 112 is deposited on the first etch stop layer 110. In one or more embodiments, the metal layer 112 comprises low resistivity core metals. In one or more embodiments, lower resistivity core metals are deposited with a high temperature bias able electrostatic chuck (ESC). In one or more embodiments, the metal layer 112 is deposited by a physical vapor deposition process. In one or more embodiments, the metal layer 112 may comprise one or more of ruthenium (Ru), molybdenum (Mo), tungsten (W), copper (Cu), cobalt (Co), iridium (Ir), metal silicides, metal alloys, and the like. In one or more embodiments, the metal layer 112 comprises one or more of ruthenium (Ru), molybdenum (Mo), tungsten (W), copper (Cu), cobalt (Co), and iridium (Ir). In specific embodiments, the metal layer 112 comprises ruthenium (Ru). In other specific embodiments, the metal layer 112 comprises molybdenum (Mo). In other specific embodiments, the metal layer 112 comprises tungsten (W).

In one or more embodiments, a target 54 comprising the metal to be sputtered to deposit metal layer 112 is provided in a processing chamber such as the chamber 50 illustrated in FIG. 1. The processing chamber may also comprise a pedestal supporting the substrate 102. The pedestal 80 comprises a high current electrostatic chuck at a temperature less than about 500° C. In one or more embodiments, the temperature is in a range of from about 200° C. to about 450° C. In one or more embodiments, a species selected from neon (Ne), argon (Ar), krypton (Kr), xenon (Xe), and combinations thereof is flown into the chamber and excited into a plasma to deposit the metal layer 112 on the first etch stop layer 110 on the substrate 102.

In one or more embodiments, a DC power source negatively biases the target from about 500 W to about 10 kW, including from about 900 W to about 8 kW, and from about 900 W to about 2 kW with respect to the grounded processing chamber 50 or grounded sidewall shield to excite the plasma processing gas, e.g. neon (Ne), argon (Ar), krypton (Kr), xenon (Xe), into a plasma.

In one or more embodiments, an AC power source provides a power in a range from about 0 W to about 500 W, including from about 200 W to about 400 W.

In one or more embodiments, the pressure of the processing chamber is in a range of from about 5 mTorr to about 100 mTorr, including from about 5 mTorr to about 50 mTorr.

Figure 4:
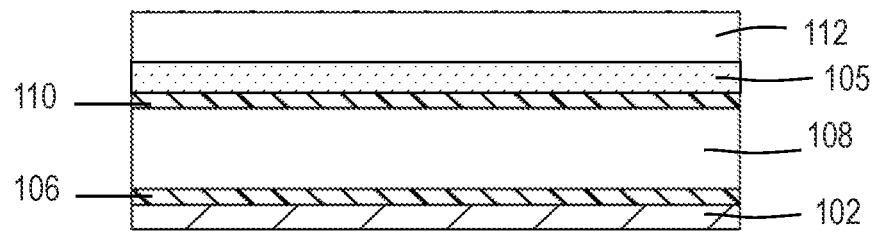
FIG. 4 illustrates a cross-sectional view of a substrate in accordance with one or more embodiments of the disclosure.

Referring to FIG. 4, in one or more embodiments, a seed metal 105 is deposited first, and then the bulk metal layer 112 is deposited on the seed metal 105. Without intending to be bound by theory, it is thought that first depositing a seed metal 105, followed by bulk metal layer 112 deposition improves the metal grain. Thus, with reference to FIG. 4, in one or more embodiments, a target 54 comprising the metal of the metal layer 112 is provided in a processing chamber. The processing chamber may also comprise a pedestal 80 supporting the substrate. The pedestal 80 comprises a high current electrostatic chuck at a temperature less than about 500° C. In one or more embodiments, the temperature is in a range of from about 200° C. to about 450° C. In one or more embodiments, a species selected from neon (Ne), argon (Ar), krypton (Kr), xenon (Xe), and combinations thereof is flown into the chamber and excited into a plasma to deposit the metal seed 105 on the first etch stop layer 110 on the substrate 102.

In one or more embodiments, the metal seed 105 comprises the same material as the metal layer 112. In one or more embodiments, the metal seed 105 comprises one or more of ruthenium (Ru), molybdenum (Mo), tungsten (W), copper (Cu), cobalt (Co), iridium (Ir), metal silicides, and metal alloys. In one or more embodiments, the metal seed 105 comprises one or more of ruthenium (Ru), molybdenum (Mo), tungsten (W), copper (Cu), cobalt (Co), and iridium (Ir). In one or more specific embodiments, the metal seed 105 comprises ruthenium (Ru). In other specific embodiments, the metal seed 105 comprises molybdenum (Mo).

In one or more embodiments, a DC power source negatively biases the target 54 from about 500 W to about 10 kW with respect to the grounded processing chamber 50 or grounded sidewall shield to excite the plasma processing gas, e.g. neon (Ne), argon (Ar), krypton (Kr), xenon (Xe), into a plasma.

In one or more embodiments, an AC power source provides a power in a range from about 0 W to about 500 W.

Subsequently, in one or more embodiments, metal layer 112 is then deposited on the seed metal 105. In one or more embodiments, a target 54 comprising the metal of the metal layer 112 is provided in a processing chamber. The processing chamber may also comprise a pedestal 80 supporting the substrate. The pedestal 80 comprises a high current electrostatic chuck at a temperature less than about 500° C. In one or more embodiments, the temperature is in a range of from about 200° C. to about 450° C. In one or more embodiments, a species selected from neon (Ne), argon (Ar), krypton (Kr), xenon (Xe), and combinations thereof is flown into the chamber and excited into a plasma to deposit the metal layer 112 on the metal seed 105 on the first etch stop layer 110 on the substrate 102.

In one or more embodiments, a DC power source negatively biases the target 54 from about 900 W to about 8 kW, and from about 900 W to about 2 kW with respect to the grounded processing chamber 50 or grounded sidewall shield to excite the plasma processing gas, e.g. neon (Ne), argon (Ar), krypton (Kr), xenon (Xe), into a plasma.

In one or more embodiments, an AC power source provides a power in a range from about 200 W to about 400 W.

Figure 5:
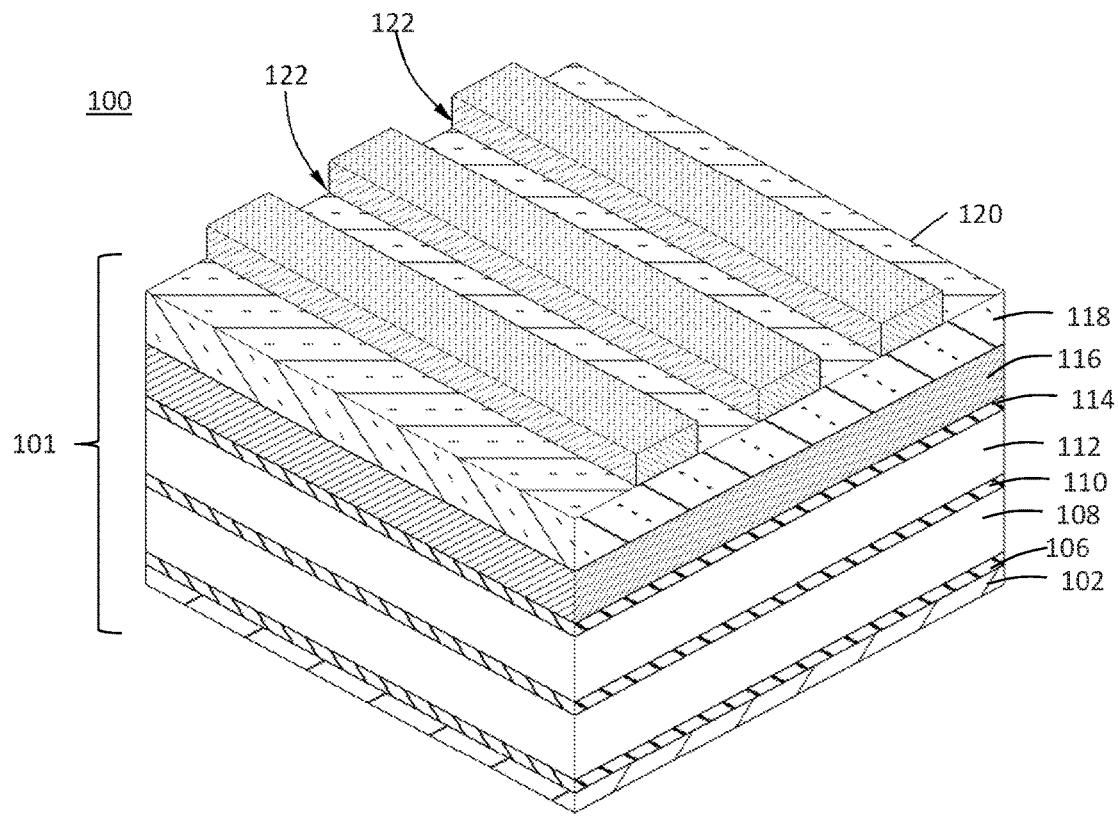
FIG. 5 illustrates an isometric view of an interconnect structure according to one or more embodiment of the disclosure.

With reference to FIG. 5, depositing the first etch stop layer 110 and the metal layer 112 (and optionally the metal seed 105) in this fashion affords an interconnect structure that does not have an etch stop layer that fails.

Figure 5A:
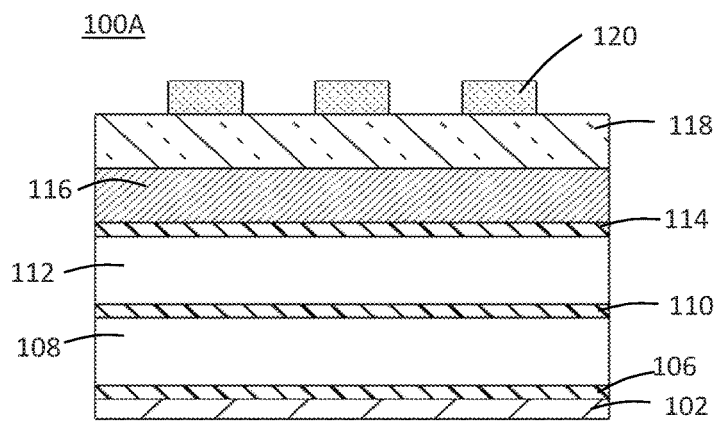
FIG. 5A illustrates cross-section view of the interconnect structure of FIG. 5 according to one or more embodiments.
Figure 5B:
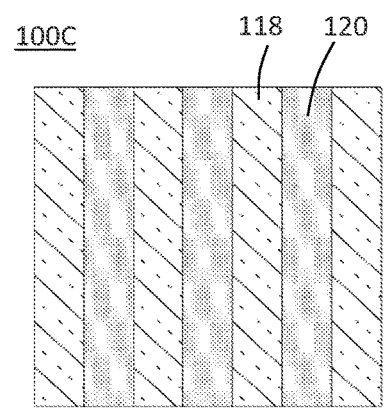
FIG. 5B illustrates a top view of the interconnect structure of FIG. 5 according to one or more embodiments.

FIG. 5 shows an isometric, three-dimensional view 100 of an exemplary starting "stack" 101 of layers to be used to form an interconnect structure. FIG. 5A illustrates a cross-section view 100A of the device illustrated in FIG. 5. FIG. 5B is a top view 100B of the interconnect structure illustrated in FIG. 5. The skilled artisan will recognize that the exemplified "stack" 101 is merely one possible configuration and should not be taken as limiting the scope of the disclosure.

In one or more embodiments, the first metal (conductive) layer 108 is on the optional barrier layer 106; or on the substrate 102 if the optional barrier layer 106 is omitted. In one or more embodiments, the barrier layer 106 comprises a liner. The first metal layer 108 can be any suitable layer deposited by any suitable technique known to the skilled artisan. In one or more embodiments, the first metal layer 108 is deposited using physical vapor deposition, as discussed above with respect to metal layer 112,. In some embodiments, the first metal layer 108 is a conformal layer of material selected from metals such as tungsten (W), cobalt (Co), ruthenium (Ru), molybdenum (Mo), aluminum (Al), copper (Cu), silicide, graphene, or combinations thereof, for example and not by way of limitation. In one or more embodiments, the first metal layer comprises ruthenium (Ru).

In one or more embodiments, the first etch stop layer 110, which is also a conductor layer, overlies the first metal layer 108. In one or more embodiments, the second metal layer 112 is formed on the first etch stop layer 110. The second metal layer 112 may (but need not be) the same as the first metal layer 108 described above. In one or more embodiments, the second metal layer 112 comprises a pillar-forming metal. In some embodiments, the pillar-forming metal is selected from one or more of tungsten (W), cobalt (Co), ruthenium (Ru), molybdenum (Mo), aluminum (Al), copper (Cu), silicide, graphene, or combinations thereof, for example and not by way of limitation. In one or more embodiments, the second metal layer 112 comprises ruthenium (Ru).

In one or more embodiments, the first etch stop layer 110 is for etch stop of the second metal layer 112. In one or more embodiments, the second metal layer 112 comprises ruthenium (Ru), and the first etch stop layer 110 comprises one or more of titanium, tantalum, titanium nitride (TiN), tantalum nitride (TaN), tungsten (W), molybdenum (Mo), or the like. In one or more embodiments, when the first metal layer 108 and second metal layer 112 are different materials and have high etch selectivity to etch other, the first etch stop layer 110 is omitted.

In one or more embodiments, a second etch stop layer 114 overlies the second metal layer 112. In one or more embodiments, the second etch stop layer 114 composition may be (but need not be) the same as the first etch stop layer 110. In one or more embodiments, having the first etch stop layer 110 and second etch stop layer 114 as the same material simplifies processing. In one or more embodiments, the second etch stop layer 114 can be any suitable material, including, but not limited to a conformal layer of tantalum (Ta), tantalum nitride (TaN), titanium (Ti), titanium nitride (TiN), W, Co, Ru, niobium (Nb), niobium nitride (NbN), and combinations thereof, which are deposited using a technique selected from CVD, PVD, ALD, deposition from an evaporated source of metal, metal plating, or may be an oxide of titanium (Ti), which is doped with a dopant such as a silicide.

In one or more embodiments, the second etch stop layer 114 is for etch stop of the hard mask layer 116. In one or more embodiments, the hard mask layer 116 comprises silicon oxide, and the second etch stop layer 114 comprises one or more of titanium (Ti), tantalum (Ta), titanium nitride (TiN), tantalum nitride (TaN), silicon nitride (SiN), silicon carbonitride (SiCN), silicon oxynitide (SiON), or the liked. In one or more embodiments, the second etch stop layer 114 is omitted, is not present. In some embodiments, when the etch chemicals for hard mask layer 116 do not impact the second metal layer 112, such as, for example, when hard mask layer 116 comprises silicon oxide (SiO) and second metal layer 112 comprises ruthenium, the second etch stop layer 114 is not present.

In one or more embodiments, a hard mask layer 116 overlies the second etch stop layer 114. In one or more embodiments, the hard mask layer is used in combination with an overlying "lithography stack" to transfer a device pattern through underlying layers 114, 112, 110, and 108 which are described above. In one or more embodiments, the hard mask layer 116 is a single layer. In other embodiments, the hard mask layer 116 is a combination of layers. The hard mask layer 116 is not described herein, but, in one or more embodiments, is fabricated using materials and patterning techniques which are known in the art as being capable of providing a pattern at a 10 nm Node (16 nm HPCD) or lower. In some embodiments, the hard mask layer 116 comprises a metallic or dielectric mask material. Suitable dielectric materials include, but are not limited to, silicon oxide (SiO), silicon nitride (SiN), silicon carbide (SiC), aluminum oxide ($AlO_x$), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

In one or more embodiments, a bottom anti-reflective coating (BARC) 118 and photoresist 120 are formed thereon. The photoresist 120 illustrated is patterned with trenches 122; however, the pattern can be any suitable shape or combination of shapes.

In one or more embodiments, the combination of the hard mask layer 116, the bottom anti-reflective coating (BARC) 118, and the photoresist 120 are herein referred to the first "lithographic patterning structure."

Figure 6:
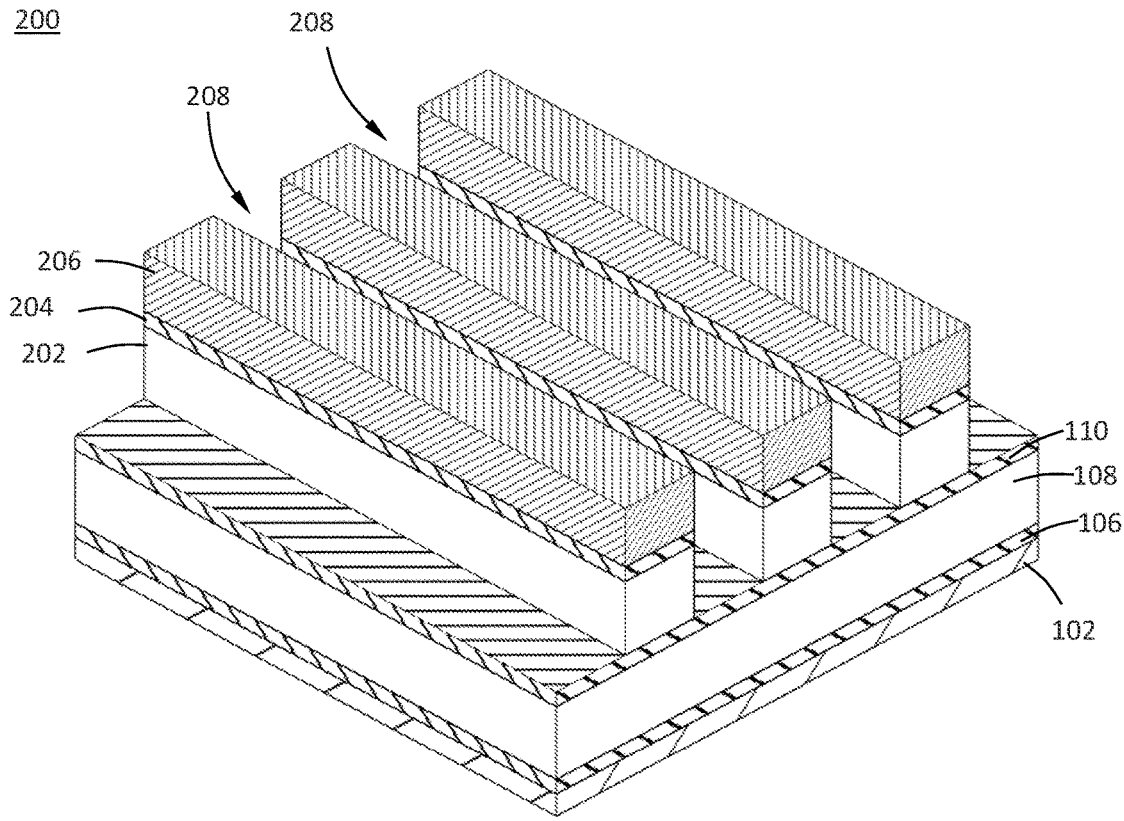
FIG. 6 is illustrates an isometric view of an interconnect structure according to one or more embodiment of the disclosure.
Figure 6A:
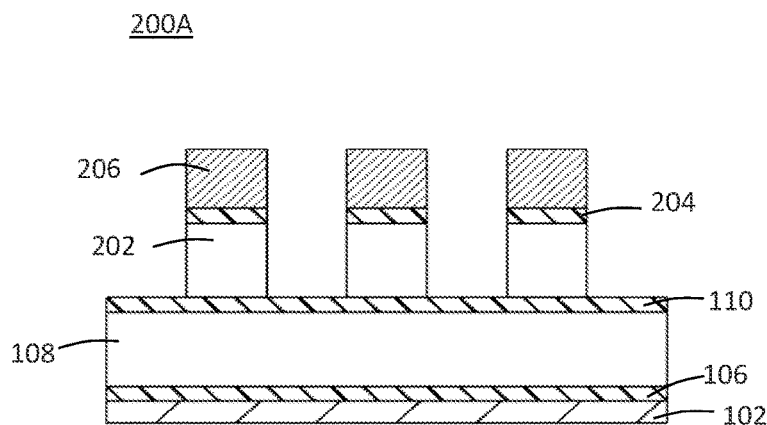
FIG. 6A illustrates cross-section view of the interconnect structure of FIG. 6 according to one or more embodiments.
Figure 6B:
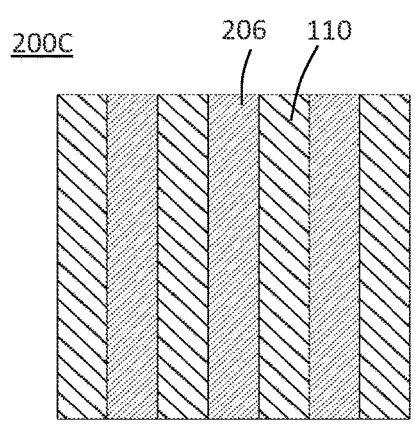
FIG. 6B illustrates a top view of the interconnect structure of FIG. 6 according to one or more embodiments.

FIG. 6 illustrates an isometric view 200 of a partially patterned structure formed from the starting stack 101 illustrated in FIG. 5. FIG. 6A illustrates a cross-section view 200A of the structure illustrated in FIG. 6. FIG. 6B is a top view 200B of the structure illustrated in FIG. 6. In one or more embodiments, the second metal layer 112 is etched in a first direction to the top surface of first etch stop layer 110, to create upwardly extending first conductive lines 202 above the first etch stop layer 110. In one or more embodiments, forming the first conductive lines 202 comprises exposing the patterned interconnect stack 101 to an etch gas and etching the patterned interconnect stack with a high etch rate. In one or more embodiments, the second metal layer 112 is etched with a high rate in a range of about 0.5 nm/s to about 5 nm/s, including about 1 nm/s, about 1.5 nm/s, about 2 nm/s, about 2.5 nm/s, about 3 nm/s, about 3.5 nm/s, about 4 nm/s, about 4.5 nm/s, or about 5 nm/s, for a period of time in the range of about 10 seconds to about 100 seconds, including about 10 seconds to about 80 seconds, about 20 seconds to about 90 seconds, or about 10 seconds to about 60 seconds. Without intending to be bound by theory, it is thought that the combination of the high etch rate for a short period of time minimizes sputter of the hard mask layer 116. In one or more embodiments, the second metal layer 112 comprises ruthenium (Ru) and is etched in a SYM3® Etch chamber of Applied Materials, Inc. Santa Clara, Calif., SCLA etc. In one or more embodiments, the source power is in the range of about 500 Watts (W) to about 1800 W, the bias power is in a range of about 50 W to about 300 W, the bias power pulsing duty cycle is in the range about 15% to about 90%, the pressure is in the range of about 5 mTorr to about 50 mTorr, the electrostatic chuck temperature is in the range of about 30° C. to about 90° C., the gas flow of oxygen is in the range of about 100 sccm to about 700 sccm, and the gas flow of chlorine is in the range of about 20 sccm to 100 sccm.

In one or more embodiments, overlying the conductive lines 202 formed from the second metal layer 112 are lines 204 of the second etch stop layer 114, and lines 206 of hard mask layer 116. In one or more embodiments, the conductive lines 202 are formed from a metal, and that metal is one which provides the effective resistivity dictated by the node size of the semiconductor structure. In one or more embodiments, trenches 208 separate rows of second metal layer 112, which will be further processed to become conductive interconnect contacts.

Figure 7:
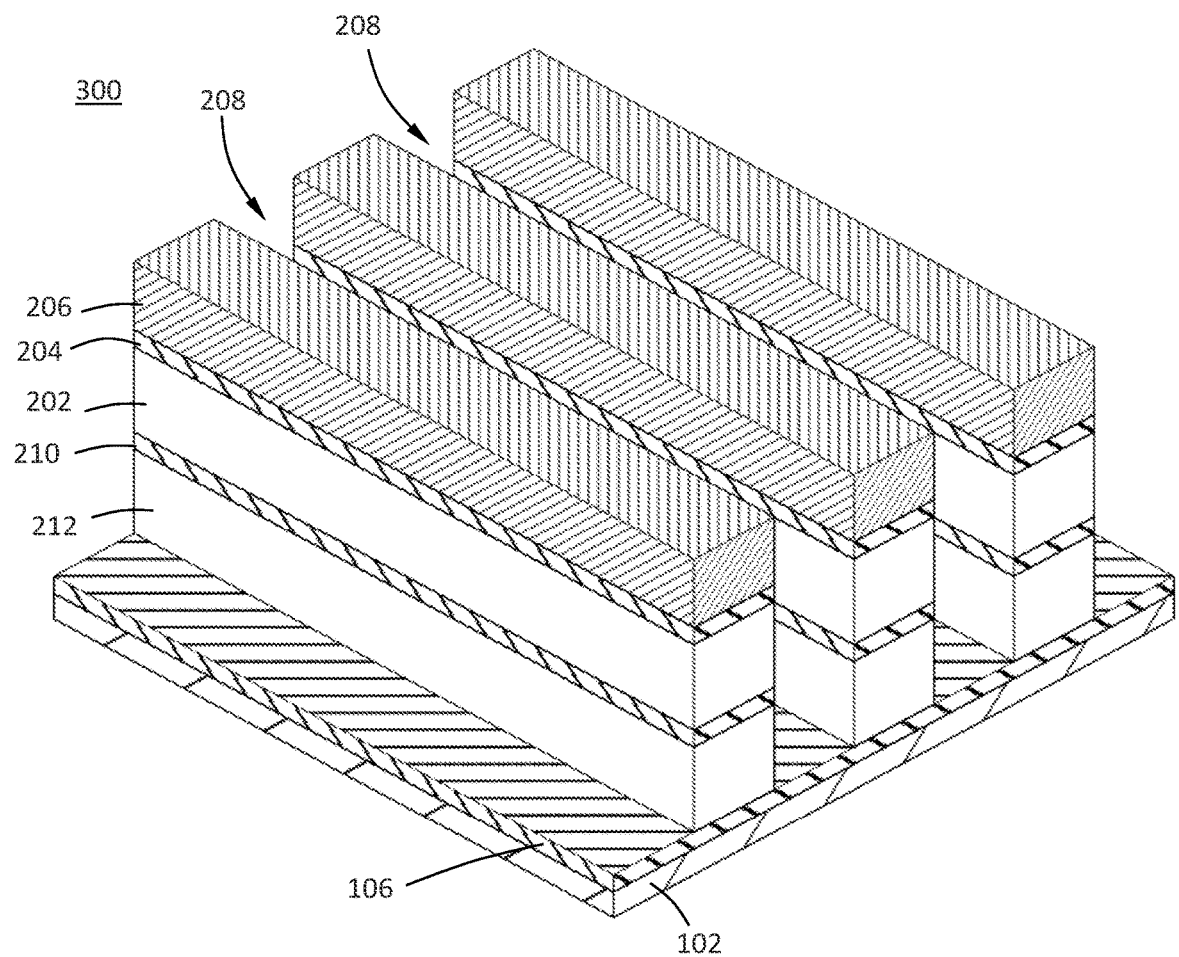
FIG. 7 is illustrates an isometric view of an interconnect structure according to one or more embodiment of the disclosure.
Figure 7A:
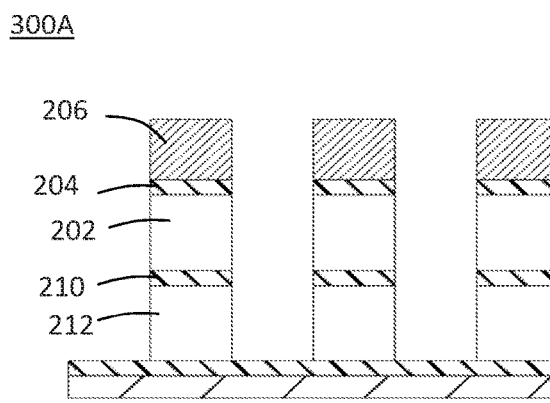
FIG. 7A illustrates cross-section view of the interconnect structure of FIG. 7 according to one or more embodiments.
Figure 7B:
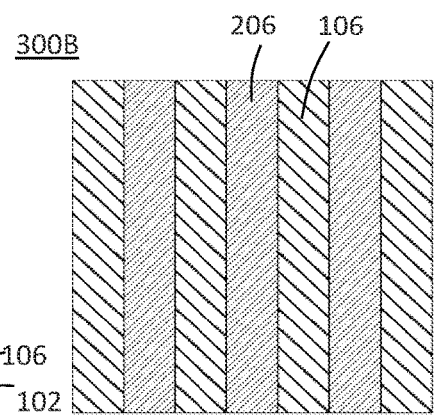
FIG. 7B illustrates a top view of the interconnect structure c of FIG. 7 according to one or more embodiments.

FIG. 7 illustrates an isometric, three-dimensional view 300 of the partially patterned structure shown in FIG. 6 after the removal of the patterning stack. FIG. 7A illustrates a cross-section view 300A of the structure illustrated in FIG. 7. FIG. 7B is a top view 300B of the structure illustrated in FIG. 7. In one or more embodiments, the first etch stop layer 110 is etched to the top surface of the first metal layer 108, and the first metal layer 108 is then etched form second conductive lines 212 above the optional barrier layer 106 on the substrate 102. In one or more embodiments, the barrier layer 106 comprises a liner. In one or more embodiments, the first etch stop layer 110 is titanium nitride (TiN) and is etched in a SYM3® Etch chamber of Applied Materials, Inc. Santa Clara, Calif.. In one or more embodiments, the source power in a range of about 300 W to about 1000 W, the bias power in is a range of about 50 W to about 300 W, the pressure is in a range of about 4 to about 15 mTorr, the electrostatic chuck temperature is in a range of about 30° C. to about 70° C., the gas flow of chlorine is in a range of about 30 sccm to about 250 sccm, the gas flow of methane is in a range of about 10 sccm to about 100 sccm, and the gas flow of nitrogen is in the range of about 30 to about 500 sccm. In one or more embodiments, the titanium nitride (TiN) etch process is etched by pulsing the bias and source power in a frequency range of about 1000 Hz to about 10000 Hz and a duty cycle range of about 15% to about 90%.

Figure 8:
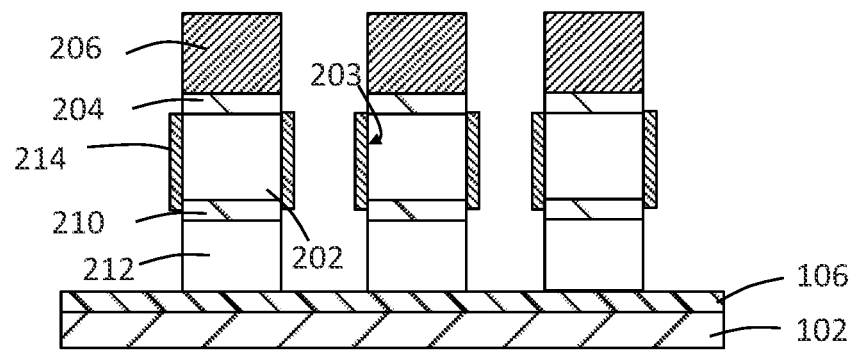
FIG. 8 illustrates cross-section view of an interconnect structure according to one or more embodiments.

FIG. 8 illustrates a cross-section view of a structure according to one or more embodiments. Referring to FIG. 8, in one or more embodiments, the second metal layer 112 of the first conductive line 202 is passivated in the etch process of the first metal layer 108. Etching with passivation reduces erosion/necking of the sidewalls of first conductive lines 202 by a preventing an active species (e.g., radicals or energetic ions) from reacting with the first conductive lines 202. In one or more embodiments, the sidewalls 203 of first conductive lines 202 are passivated by utilizing a hard mask sputtering effect to sputter hard mask material 214 to the sidewall 203 of first conductive lines 202. In one or more embodiments, the sputtered hard mask material 214 is an oxide, e.g. silicon oxide, and the first metal layer 108 is ruthenium (Ru). In one or more embodiments, the hard mask sputtering effect is achieved by mixing a dilution gas (e.g., Ar, $H_2$, He, $N_2$) with an etching gas. In one or more embodiments, the hard mask sputtering effect is achieved by mixing a dilution gas (e.g., Ar, $H_2$, He, $N_2$) with an etching gas for ruthenium (Ru) etch. In one or more embodiments, a ruthenium (Ru) etch is performed in SYM3® Etch chamber of Applied Materials, Inc. Santa Clara, Calif.. In one or more embodiments, the source power is in the range of about 300 W to about 1800 W, the bias power is in the range of about 50 W to about 300 W, the bias power pulsing duty cycle is in the range about 15% to about 90%, the pressure is in the range of about 4 mTorr to about 30 mTorr, the electrostatic chuck temperature is in the range of about 30° C. to about 90° C., the gas flow of oxygen is in the range of about 100 to about 700 sccm, and the gas flow of chlorine is in the range of about 20 to about 100 sccm. In one or more embodiments, the dilution gas is nitrogen ($N_2$) and is provided at a flow of 10 to 100 sccm.

Figure 9:
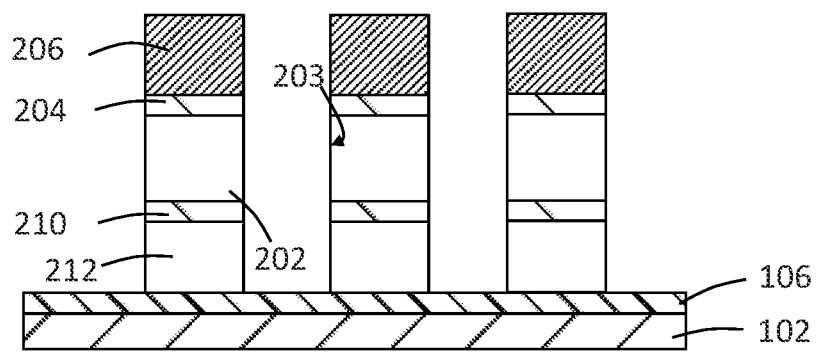
FIG. 9 illustrates cross-section view of an interconnect structure according to one or more embodiments.

FIG. 9 illustrates a cross-section view of a structure according to one or more embodiments. Referring to FIG. 9, in one or more embodiments, the sputtered hard mask 214 on the sidewalls 203 of first conductive lines 202 is then removed by a wet or dry etch process. In some embodiments, the sputtered hard mask 214 comprises a metallic or dielectric mask material. Suitable dielectric materials include, but are not limited to, silicon oxide (SiO), silicon nitride (SiN), silicon carbide (SiC), aluminum oxide ($AlO_x$), aluminum nitride (AlN) and combinations thereof. In one or more embodiments, the sputtered hardmask 214 comprises silicon oxide and is removed by a dilute hydrofluoric acid (DHF) clean. In one or more embodiments, DHF clean is performed in a dilution range of about 100:1 to about 2000:1 for a time range of about 10 seconds to about 10 minutes. In one or more embodiments, sputtering the sputtered hard mask 214 comprises adding a dilution gas to the etch gas. In one or more specific embodiments, the sputtered hard mask 214 comprises silicon oxide, the second conductive lines 212 comprise ruthenium (Ru), and the dilution gas comprises nitrogen ($N_2$).

In one or more embodiments, overlying the second conductive lines 212 formed from the first metal layer 108 are lines 210 of the first etch stop layer 110, first conductive lines 202, lines 204 of the second etch stop layer 114, lines 206 of hard mask layer 116. In one or more embodiments, the second conductive lines 212 are formed from a metal, and that metal is one which provides the effective resistivity dictated by the node size of the semiconductor structure. In one or more embodiments, trenches 208 separate rows of upwardly extending conductive lines 202, 212, which will be further processed to become conductive interconnect contacts.

Figure 10:
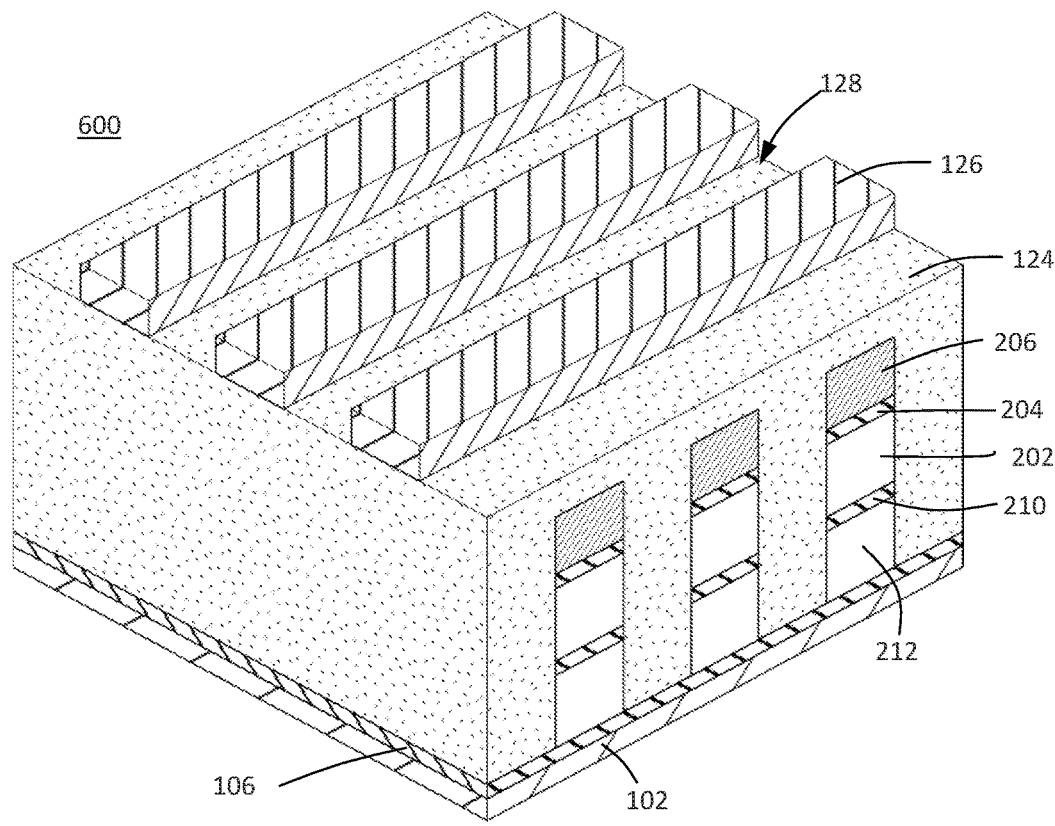
FIG. 10 is illustrates an isometric view of an interconnect structure according to one or more embodiment of the disclosure.
Figures 10A, 10B:
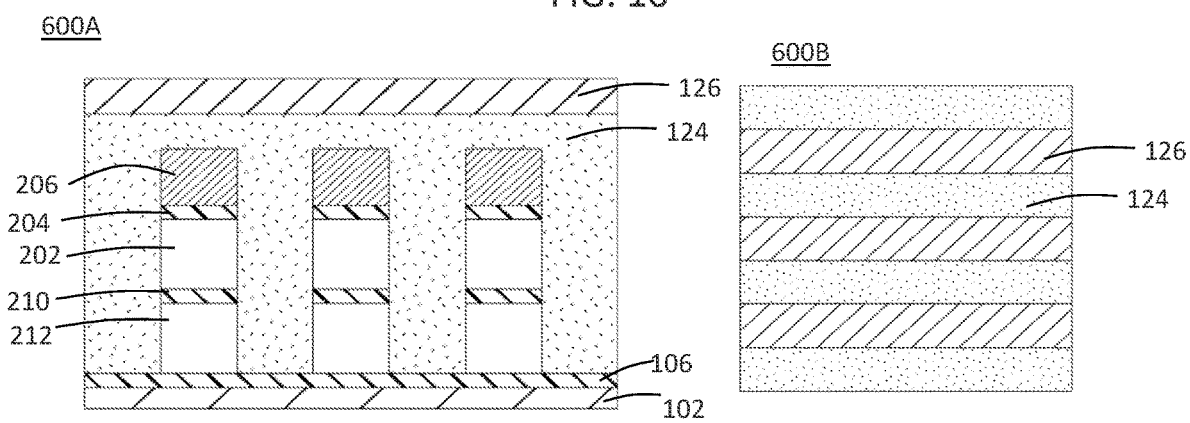
FIG. 10A illustrates cross-section view of the interconnect structure of FIG. 10 according to one or more embodiments.
FIG. 10B illustrates a top view of the interconnect structure of FIG. 10 according to one or more embodiments.

FIG. 10 illustrates an isometric, three-dimensional view 400 of the partially patterned structure shown in FIG. 7 after filling of previously etched trenches 208 with a second BARC or spin-on dielectric material 124, which is used to support a subsequently applied photoresist 126. In one or more embodiments, the BARC (bottom Anti-reflective Coating) or the spin-on dielectric material 124 is formed from at least one polymer component, a crosslinking component, and an acid generator. In one or more embodiments, the BARC or spin-on dielectric material 124 is cured after application to the substrate surfaces, so that the precursor materials are able to penetrate into spaces having a minimal critical dimension. FIG. 10A illustrates a cross-section view 600A of the structure shown in FIG. 10. FIG. 10B illustrates a top view 600B of the structure illustrated in FIG. 10, including BARC or spin-on dielectric 124 filled trenches separating rows of material which will be further processed to become conductive interconnects.

In one or more embodiments, the combination of the bottom anti-reflective coating (BARC) or spin-on dielectric material 124, and the photoresist 126 are herein referred to the second "lithographic patterning structure."

Figure 11:
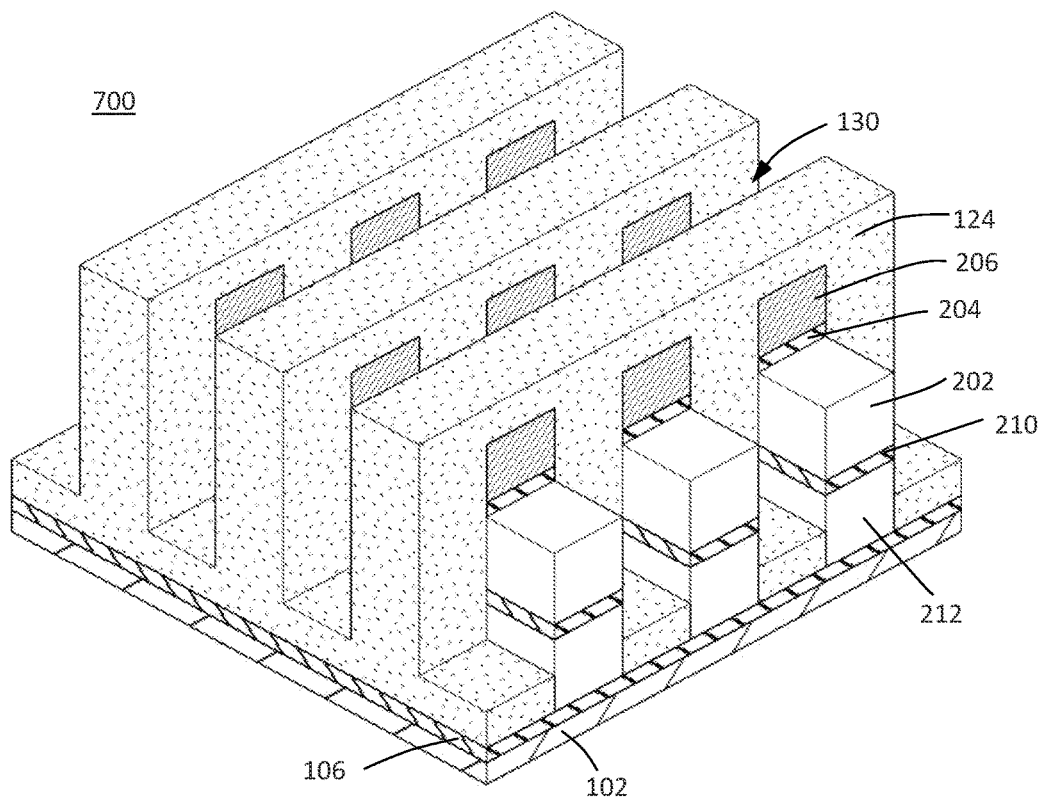
FIG. 11 is illustrates an isometric view of an interconnect structure according to one or more embodiment of the disclosure.
Figures 11A, 11B:
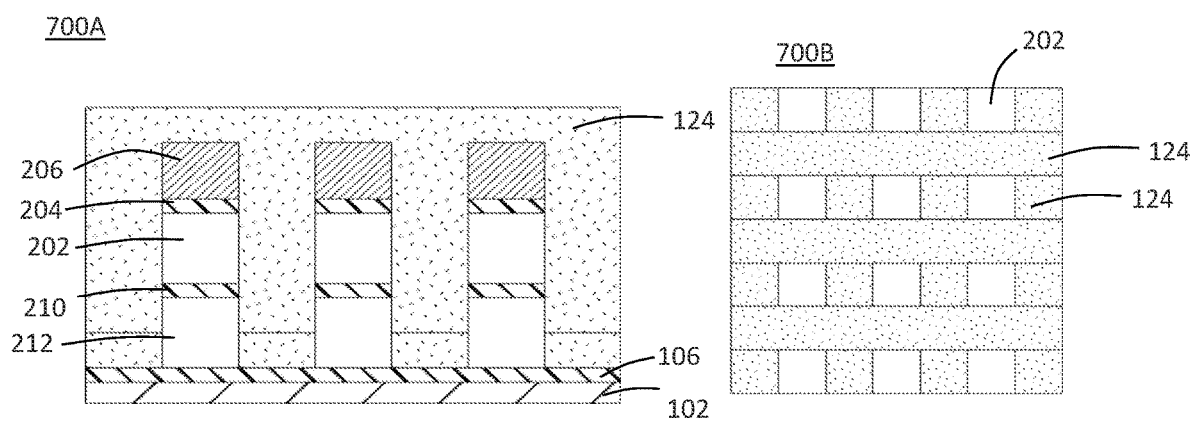
FIG. 11A illustrates cross-section view of the interconnect structure of FIG. 11 according to one or more embodiments.
FIG. 11B illustrates a top view of the interconnect structure of FIG. 7 according to one or more embodiments.

FIG. 11 illustrates an isometric, three-dimensional view 700 of the partially patterned structure shown in FIG. 10 after etching of a series of spaces (trenches) 130 at an angle to previously etched trenches 128 (not shown, as they are filled with BARC or spin-on dielectric 124). In one or more embodiments, the BARC or spin-on dielectric layer 124, and the hard mask layer 116 have been etched down to the upper surface of the first conductive lines 202. FIG. 11A illustrates a cross-section view 700A of the structure shown in FIG. 11. FIG. 11 B illustrates a top view 700B of the structure shown in FIG. 1.

Figure 12:
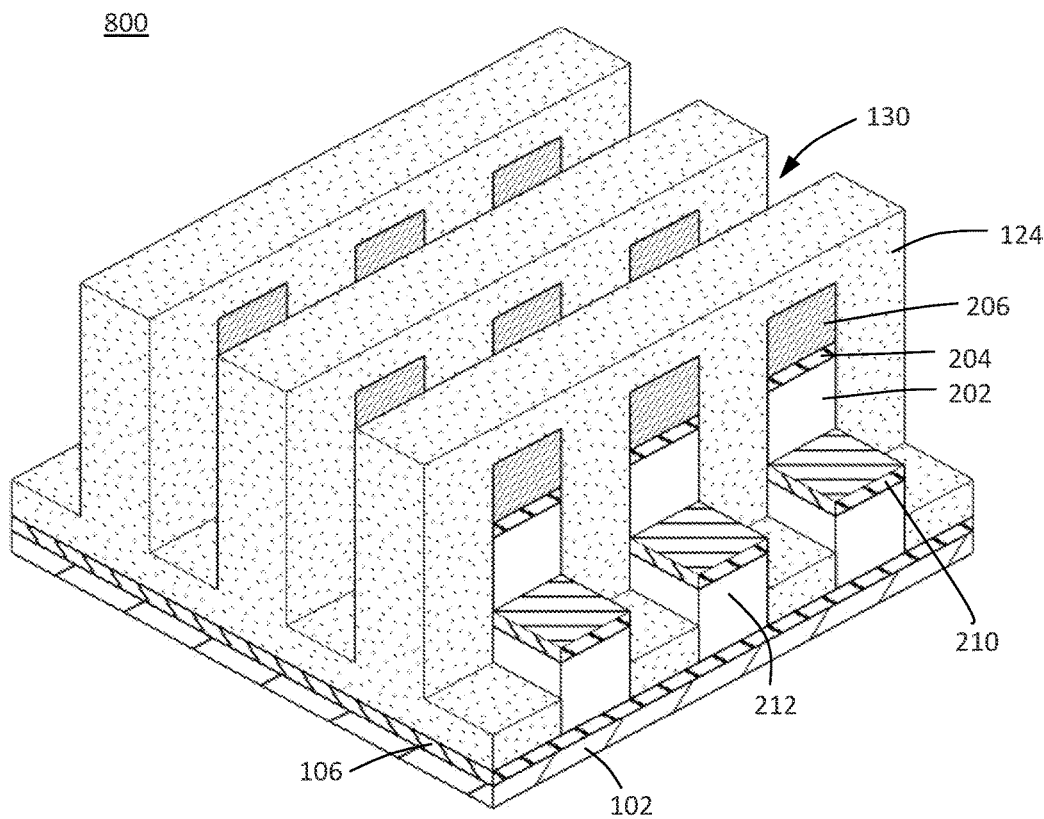
FIG. 12 is illustrates an isometric view of an interconnect structure according to one or more embodiment of the disclosure.
Figure 12A:
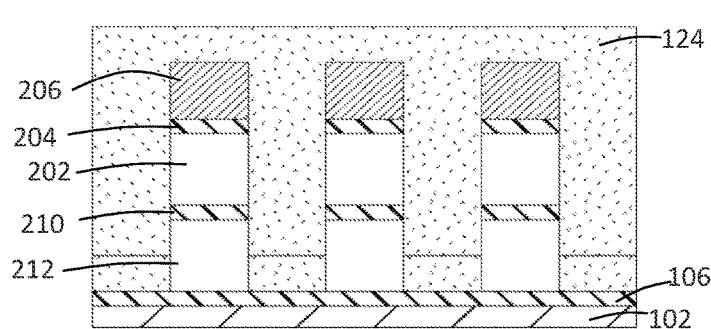
FIG. 12A illustrates cross-section view of the interconnect structure of FIG. 12 according to one or more embodiments.
Figure 12B:
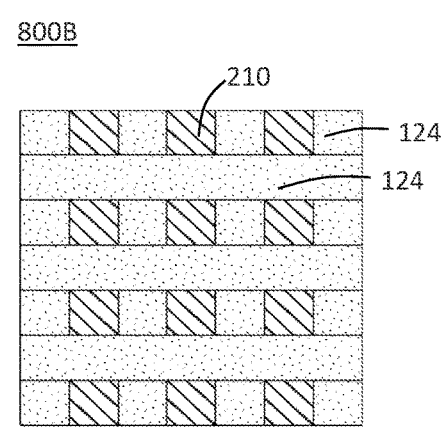
FIG. 12B illustrates a top view of the interconnect structure of FIG. 12 according to one or more embodiments.

FIG. 12 illustrates an isometric, three-dimensional view 800 of the partially patterned structure shown in FIG. 11 after etching of a series of spaces (trenches) 130 at an angle to the previously etched trenches 128 (not shown, as they are filled with BARC or spin-on dielectric 124). In one or more embodiments, the BARC or spin-on dielectric layer 124, and the conductive lines 202 have been etched to the upper surface of the lines of the first etch stop layer 210. FIG. 12A illustrates a cross-section view 800A of the structure shown in FIG. 12. FIG. 12B illustrates a top view 800B of the structure shown in FIG. 12.

FIG. 13 illustrates an isometric, three-dimensional view 900 of the partially patterned structure shown in FIG. 12, subsequent to the removal of the BARC or spin-on dielectric layer 124, typically by a dry etching process using an etchant plasma which does not affect layers 206, 202, 210, 212, 106, and 102. In one or more embodiments, the plasma etch process utilizes a mix of $H_2/N_2$ or $H_2/O_2$ and with or without any dilution gas (e.g., Ar, He). FIG. 13A illustrates shows a cross-section view 900A of the structure shown in FIG. 13. FIG. 13B shows a top view 900B of the structure shown in FIG. 13.

Figure 14:
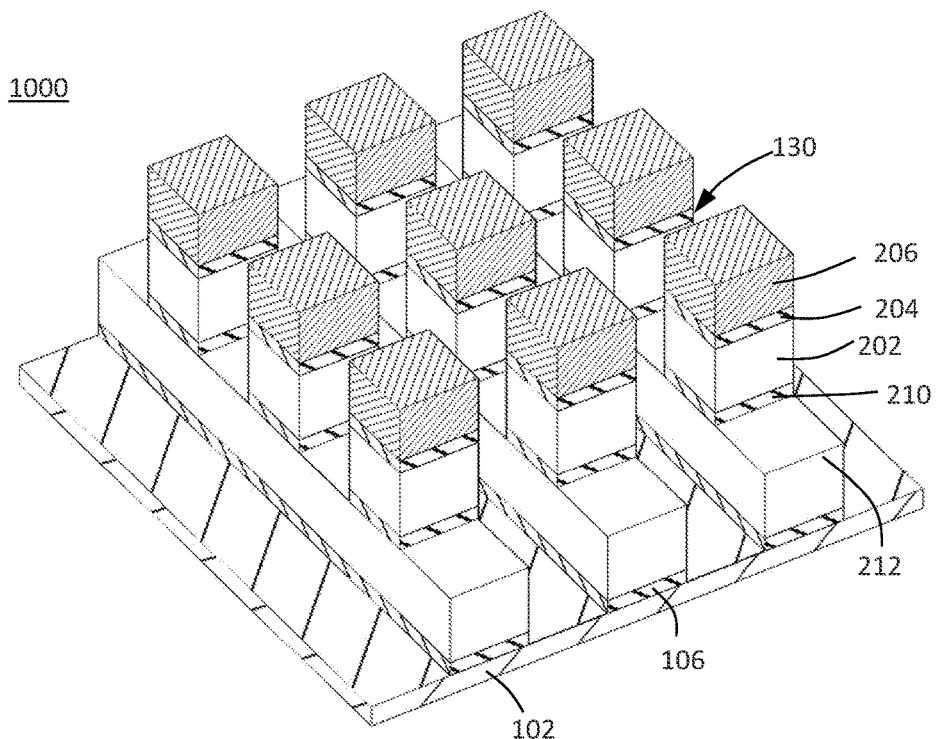
FIG. 14 is illustrates an isometric view of an interconnect structure according to one or more embodiment of the disclosure.
Figure 14A:
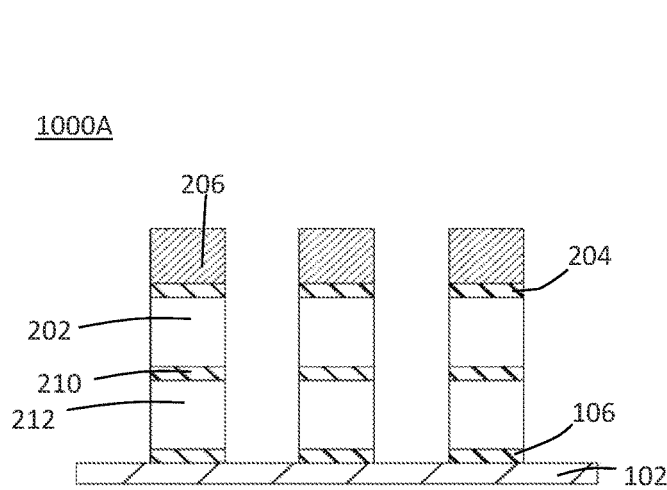
FIG. 14A illustrates cross-section view of the interconnect structure of FIG. 14 according to one or more embodiments.
Figure 14B:
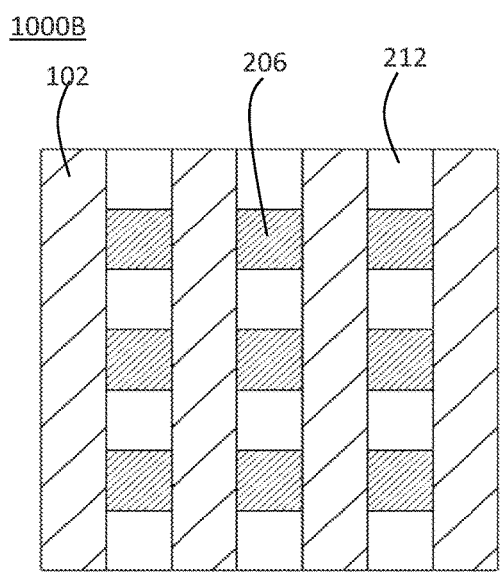
FIG. 14B illustrates a top view of the interconnect structure of FIG. 14 according to one or more embodiments.

FIG. 14 illustrates an isometric, three-dimensional view 100 of the partially patterned structure shown in FIG. 13, subsequent to the removal of the first etch stop layer 210 and the barrier layer 106, typically by a dry etching process using an etchant plasma which does not affect layers 202, 210, 212, 106, and 102. In one or more embodiments, the plasma etch process utilizes a mix of $H_2/N_2$ or $H_2/O_2$ and with or without any dilution gas (e.g., Ar, He). Without intending to be bound by theory, it is thought that because the first etch stop layer 210 and the barrier layer 106 are conductive layers, they must be etched in the same pattern as the first metal layer 108 to prevent any line short. In one or more embodiments, the barrier layer 106 comprises a liner that must be etched. FIG. 14A illustrates shows a cross-section view 1000A of the structure shown in FIG. 14. FIG. 14B shows a top view 1000B of the structure shown in FIG. 14.

Figure 15:
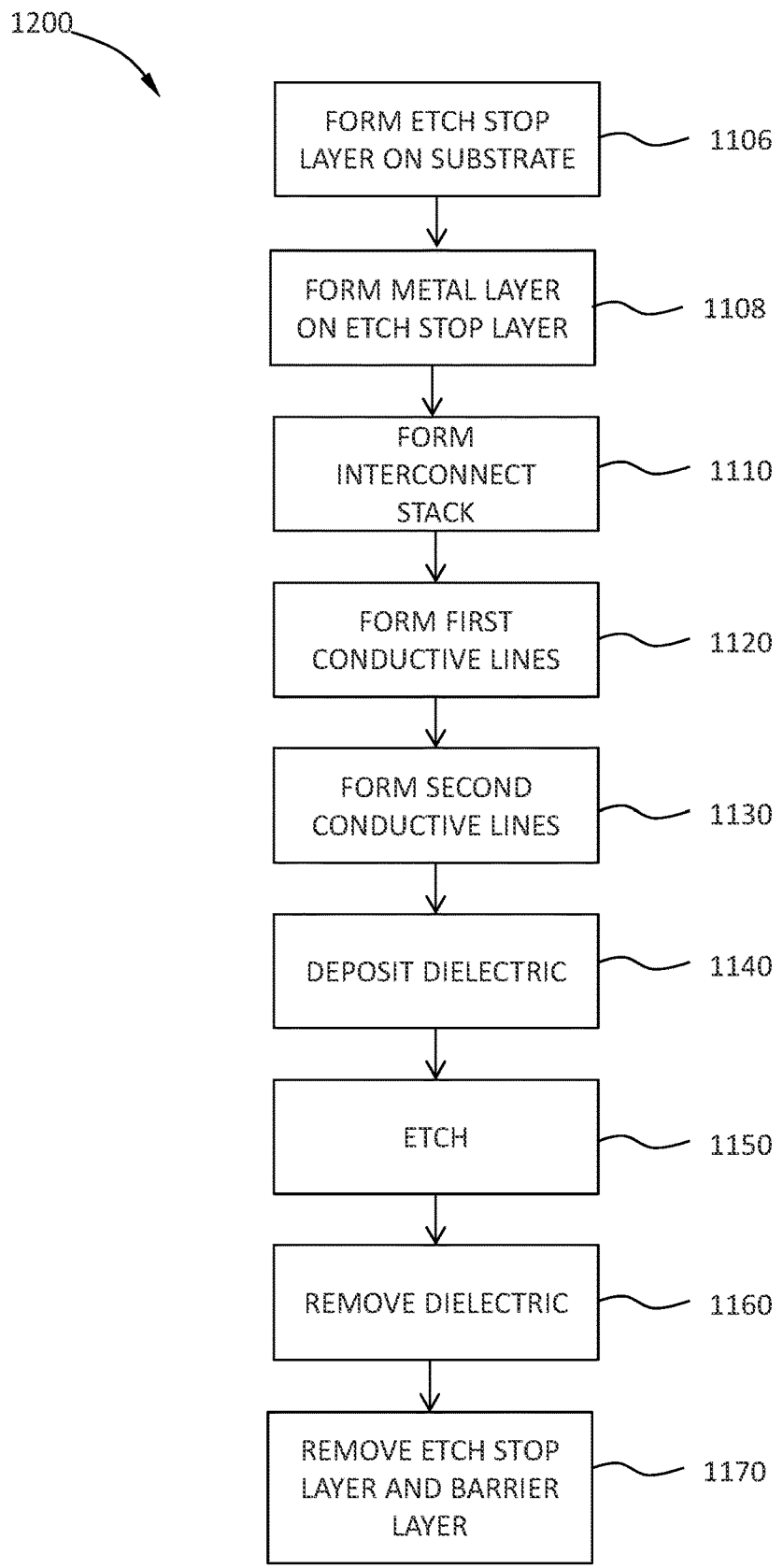
FIG. 15 depicts a flowchart of a method in accordance with one or more embodiments of the disclosure.

FIG. 15 illustrates a process flow diagram of a method 1100 according to one or more embodiments of the present disclosure. At operation 1106 an etch stop layer is formed on a substrate. As discuss above, the etch stop layer may be formed by physical vapor deposition (PVD) to deposit a thin film. At operation 1108, a metal layer is deposited by physical vapor deposition on the etch stop layer. At operation 1110 an interconnect stack is formed. At operation 1120, first conductive lines are formed (e.g. by a subtractive etching process). At operation 1130, second conductive lines are formed (e.g. by a subtractive etching process). At operation 1140, a dielectric material (e.g. BARC or spin-on dielectric) is deposited. At operation 1150, the interconnect device is etched to form self-aligned vias. At operation 1160, the dielectric material is removed. At operation 1170, the first etch stop layer 210 and the barrier layer 106 are etched. In one or more embodiments, the barrier layer 106 comprises a liner that is etched.

In some embodiments, the deposition of the first etch stop layer 110 and the second metal layer 112 are performed in an integrated system. In one or more embodiments, the integrated system prevents oxidation of the first etch stop layer 110, which can increase resistivity of the first etch stop layer 110. In some embodiments, the deposition of the barrier layer 106 and the first metal layer 108 are performed in an integrated system. In one or more embodiments, the integrated system prevents oxidation of the barrier layer 106, which can increase resistivity of the barrier layer 106. In one or more embodiments, the barrier layer 106 comprises a liner, and the integrated system prevent oxidation of the liner, which can increase resistivity of the liner.

By using a stack of varying layers which include line metal; etch stop material layers having a relatively high conductivity component (in the form of metal or doped ceramic or polymeric material); and, pattern transfer layers which make up a lithography stack (typically including a hard masking material); and by applying subtractive techniques to form desired structures within the stack, it is possible to form interconnect conduits in the form of pillars, for example, without the need to fill a tiny capillary with a fluid conductive material. The method of forming an interconnect structure which is described above makes it possible to progress to devices at the 50 nm pitch size and below.

In one or more embodiments, the substrate is moved from a first physical vapor deposition chamber, where the first etch stop layer 110 is deposited) to a separate, second physical vapor deposition chamber, where the metal layer 108 is deposited. In one or more embodiments, the movement of the substrate from the first chamber to the second chamber is an integrated process conducted under vacuum where there is no air break.

In one or more embodiments, the substrate is then moved to another processing chamber for further processing. The substrate can be moved directly from the physical vapor deposition chambers to the separate processing chamber, or it can be moved from the physical vapor deposition chambers to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants.

According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 16:
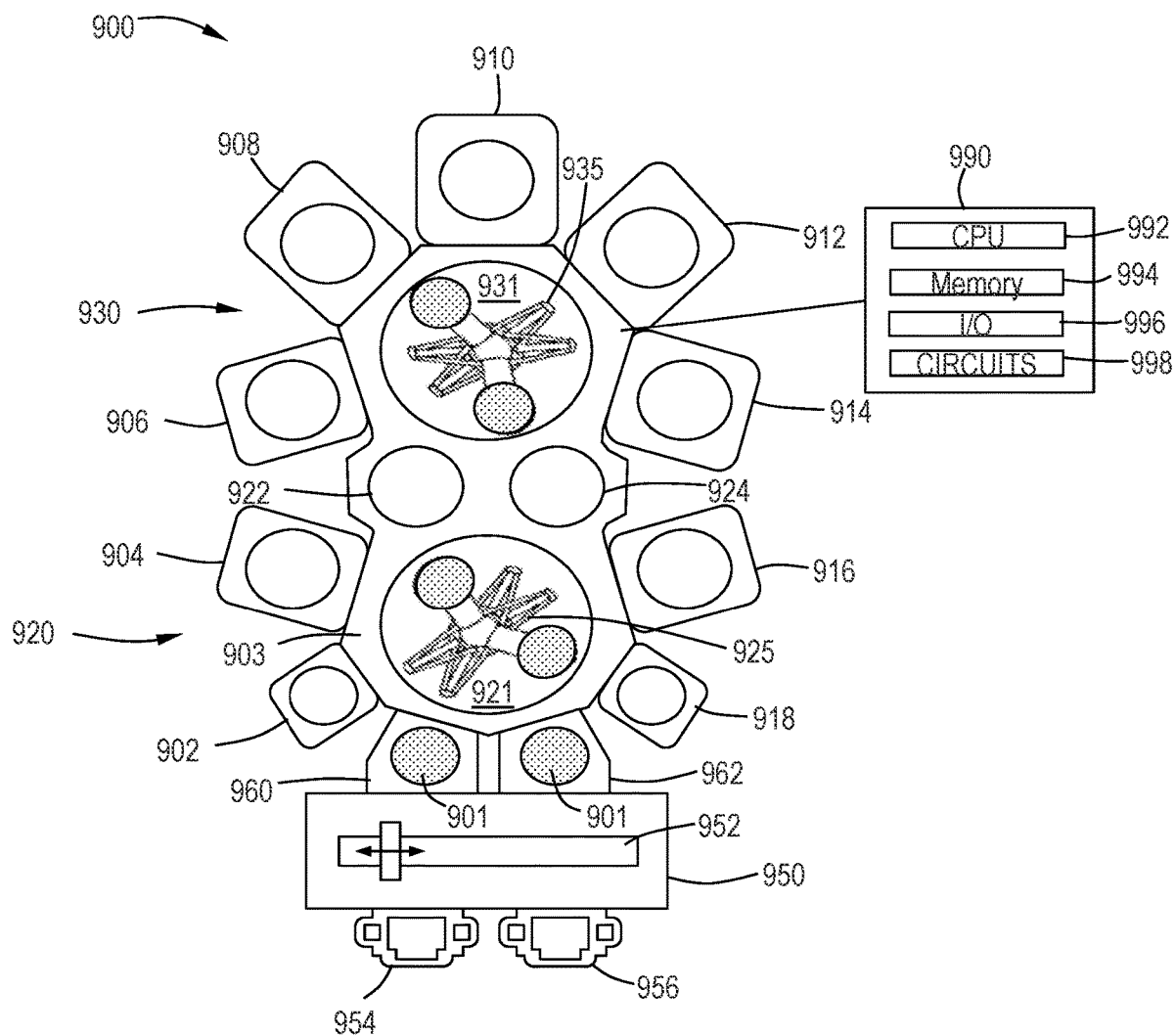
FIG. 16 illustrates a cluster tool according to one or more embodiments.

Additional embodiments of the disclosure are directed to processing tools 900 for the formation of the memory devices and methods described, as shown in FIG. 16. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a physical vapor deposition chamber, transfer space(s), a wafer orienter/degas chamber, an annealing chamber, an etching chamber, and the like. The particular arrangement of process chambers and components can be varied depending on the cluster tool and should not be taken as limiting the scope of the disclosure.

In some embodiments, the cluster tool 900 includes at least one physical vapor deposition chamber. In some embodiments, the cluster tool 900 includes two physical vapor deposition chambers connected to the central transfer station.

In the embodiment shown in FIG. 16, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control a physical vapor deposition chamber to deposit an etch stop layer on a wafer at a temperature in the range of about 20° C. to about 400° C. and control an RF power source to have a power in a range of from about 1 kW to about 10 kW.

In some embodiments, the system controller 990 has a configuration to control a physical vapor deposition chamber to deposit a metal layer on an etch stop layer on a wafer at a temperature in the range of about 200° C. to about 450° C. and control an DC power source to have a power in a range of from about 500 W to about 10 kW, at a pressure in a range of from about 5 mTorr to about 100 mTorr.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a first physical vapor deposition chamber and a second physical vapor deposition chamber; and a controller connected to the central transfer station and the plurality of process stations, the controller configured to activate the robot to move the wafer between process stations, and to control a process occurring in each of the process stations.

The disclosure is now described with reference to the following examples. Before describing several exemplary embodiments of the disclosure, it is to be understood that the disclosure is not limited to the details of construction or process steps set forth in the following description. The disclosure is capable of other embodiments and of being practiced or being carried out in various ways.

EXAMPLES

Example 1

A layer of titanium nitride (TiN) having a thickness of about 1.5 nm was formed on a substrate by physical vapor deposition. The TiN layer was formed in a PVD chamber at a temperature of 260° C.

A layer of ruthenium (Ru) having a thickness of 10 to 100 nm was formed on the titanium nitride (TiN) layer by physical vapor deposition. The Ru layer was formed in a PVD chamber at a temperature in a range of about 250° C. to about 450° C.

The two physical vapor deposition processing chambers were integrated and the deposition processes were performed under vacuum with no air break.

The substrate with the Ru on the TiN etch stop layer was then etched by Applied Materials SYM3 with process of combinations of halogen (Cl, Br), oxygen, Ar, He, $N_2$, pressurized at <100 mTorr, in direct plasma environment of source and bias

Example 2

Comparative

A layer of titanium nitride (TiN) having a thickness of about 1.5 nm was formed on a substrate by atomic layer deposition. The TiN layer was formed in an atomic layer deposition chamber at a temperature of 340° C.

A layer of ruthenium (Ru) having a thickness of 10-100 nm was formed on the titanium nitride (TiN) layer by chemical vapor deposition (CVD). The Ru layer was formed in a chemical vapor deposition chamber at a temperature of about 150° C. to about 250° C.

The atomic layer deposition process chamber and the chemical vapor deposition chamber were integrated in a process tool and the deposition processes were performed under vacuum with no air break.

The substrate with the Ru on the TiN etch stop layer was then etched by Applied Materials SYM3 with process of combinations of halogen (Cl, Br), oxygen, Ar, He, N$_2$, pressurized at <100 mTorr, in direct plasma environment of source and bias. There was no margin for TiN etch stop layer to open. Lines merged due to TiN impurity and TiN oxidation (TiOx).

Example 3

Comparative

A layer of titanium nitride (TiN) having a thickness of about 1.5 nm was formed on a substrate by physical vapor deposition. The TiN layer was formed in a physical vapor deposition chamber at a temperature of room temperature to 300° C.

A layer of ruthenium (Ru) having a thickness of 10-100 nm was formed on the titanium nitride (TiN) layer by physical vapor deposition. The Ru layer was formed in a physical vapor deposition chamber at a temperature of 250-450° C.

The two physical vapor deposition processing chambers were not integrated in a single processing tool, and there was an air break between deposition of the TiN and deposition of the Ru layer.

The substrate with the Ru on the TiN etch stop layer was then etched by Applied Materials SYM3 with process of combinations of halogen (Cl, Br), oxygen, Ar, He, N$_2$, pressurized at <100 mTorr, in direct plasma environment of source and bias.

Results:

| Metrics | Example 1 | Example 2 | Example 3 |
|---|---|---|---|
| Thin Film Growth | 3 Å/s DR | 1-2 Å per cycle | >10 Å/s |
| Resistivity (ρ) | 200 μΩ-cm | >500 μΩ-cm | 200 μΩ-cm |
| Etch-Stop Power | >100% over-etch (OE) @ 1.5 nm | Residues (film impurity) | — |
| Integrated with Ru | Yes | Yes | No |

The results illustrate that the device formed in Example 1 has superior resistivity compared to the devices of Examples 2 and 3. The device (stack) of Example 1 has 15-50% more line resistance and 20-30% more via resistance reduction. Additionally, the TiN etch stop layer of Example 1 can be successfully over etched without the etch stop layer failing, while the etch stop layers of Examples 2 and 3 cannot be over etched.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing tool comprising:
 a central transfer station comprising a robot configured to move a wafer, the wafer continuously under vacuum and not exposed to ambient air; and
 a plurality of process stations, each process station connected to the central transfer station and providing a processing region separated from processing regions of adjacent process stations, the plurality of process stations comprising a first physical vapor deposition chamber and a second physical vapor deposition chamber;
 a controller connected to the central transfer station and the plurality of process stations, the controller configured to activate the robot to move the wafer between the first physical vapor deposition chamber and the second physical vapor deposition chamber without breaking vacuum, and to control a process occurring in each of the process stations,
 wherein the controller controls a first process comprising depositing an etch stop layer on a substrate by physical vapor deposition in the first physical vapor deposition chamber at a temperature in a range of from about 200° C. to about 300° C., and
 wherein the controller controls a second process comprising in situ depositing a metal layer on the etch stop layer by flowing a plasma processing gas into the second physical vapor deposition chamber at a temperature in a range of from about 200° C. to about 450° C. and exciting the plasma processing gas into a plasma to deposit the metal layer on the etch stop layer on the substrate.

2. The processing tool of claim 1, wherein the first physical vapor deposition chamber includes a first target comprising one or more of titanium (Ti), titanium nitride (TiN), tantalum (Ta), tantalum nitride (TaN), molybdenum (Mo), tungsten (W), and ruthenium (Ru).

3. The processing tool of claim 2, wherein the second physical vapor deposition chamber includes a second target comprising one or more of ruthenium (Ru), molybdenum (Mo), tungsten (W), copper (Cu), cobalt (Co), iridium (Ir), metal silicides, and metal alloys.

4. The processing tool of claim 1, further comprising an RF power source with a power in a range of from about 1 kW to about 10 kW.

5. The processing tool of claim 1, wherein the RF power source has a power in a range of from about 2 kW to about 3 kW.

6. The processing tool of claim 1, further comprising a power source that negatively biases a metal target from about 500 W to about 10 kW to excite the plasma processing gas into a plasma.

7. The processing tool of claim 1, wherein the plasma processing gas comprises one or more of neon (Ne), argon (Ar), krypton (Kr), xenon (Xe).

8. The processing tool of claim 1, wherein the plasma processing gas comprises krypton (Kr).

9. The processing tool of claim 1, wherein the controlled is configured to control a third process comprising depositing a metal seed on the etch stop layer prior to deposition of the metal layer, wherein deposition of the metal seed comprises flowing a plasma processing gas into the chamber and exciting the plasma processing gas into a plasma to deposit the metal seed on the etch stop layer.

10. The processing tool of claim 9, wherein the metal seed comprises one or more of ruthenium (Ru), molybdenum (Mo), tungsten (W), copper (Cu), cobalt (Co), iridium (Ir), metal silicides, and metal alloys.

* * * * *